United States Patent [19]

Holzmann

[11] Patent Number: 4,615,927
[45] Date of Patent: Oct. 7, 1986

[54] STRIP FOR HOLDING AND PROTECTING ELECTRICAL CONTACTS

[75] Inventor: Hubert A. Holzmann, Biblis, Fed. Rep. of Germany

[73] Assignee: Thomas & Betts Corporation, Raritan, N.J.

[21] Appl. No.: 715,133

[22] Filed: Mar. 22, 1985

[30] Foreign Application Priority Data

Mar. 26, 1984 [FR] France .................. 84 04673

[51] Int. Cl.⁴ ........................... B65D 73/02
[52] U.S. Cl. .................. 428/35; 206/328; 206/329; 206/443; 269/903
[58] Field of Search ............ 428/35; 269/903; 206/328, 329, 330, 331, 332, 347, 443, 445, 446, 478, 490; 220/21; 29/884, 837, 838, 839, 844, 845, 874

[56] References Cited

U.S. PATENT DOCUMENTS

| | | | |
|---|---|---|---|
| 3,743,087 | 7/1973 | Wise | 206/330 |
| 4,126,223 | 11/1978 | Griffin | 206/445 |
| 4,225,042 | 9/1980 | Anthone et al. | 206/332 |
| 4,442,938 | 4/1984 | Murphy | 206/329 |

OTHER PUBLICATIONS

IBM Technical Disclosure Bulletin, vol. 26, #6, Nov. 1983, pp. 2709-2710.

*Primary Examiner*—John Kittle
*Assistant Examiner*—Thomas Saitta
*Attorney, Agent, or Firm*—Robert M. Rodrick; Salvatore J. Abbruzzese

[57] ABSTRACT

The contacts (4) have a body (4a) intended to pass through an opening in a card (5) and to be brazed on one side (5a) thereof, and a head (4b) of larger width than the body (4a), intended to be positioned on the other side (5b) of the card, this head (4b) being intended to receive a complementary contact.

The strip is formed of a band (1) of plastic material resisting the heat released during brazing and having cells (2) opening on one side, these cells being adapted to receive sealingly, by elastic deformation, the heads (4b) of the contacts (4) and being spaced apart according to a given pitch.

With this type of strip, a large number of contacts (4) can be positioned in a single operation on a printed circuit card (5), the heads (4b) of the contacts being protected during the brazing and washing operations from contaminants.

16 Claims, 9 Drawing Figures

STRIP FOR HOLDING AND PROTECTING ELECTRICAL CONTACTS

FIELD OF THE INVENTION

The invention relates to a strip for holding, positioning to a given pitch and protecting contacts, in particular female contacts, to be brazed or soldered to a printed circuit card, these contacts having, on the one hand, a body intended to pass through an opening in the card and to be brazed on one side thereof and, on the other hand, a head of larger width than the body, intended to be positioned on the other side of the card, this head being intended to receive a complementary contact.

BACKGROUND OF THE INVENTION

Known strips are used, for example, to hold a certain number of contacts for ultimate connection to printed circuit boards or cards. Since, generally, the contacts are small and difficult to grasp, the strip makes handling thereof relatively easy and also facilitates storage and packing operations.

Further, with this type of strip, a large number of contacts may be positioned in a single operation, and fairly conveniently, to a given pitch on a printed circuit card where they are to be held in position in their respective holes during the brazing operation.

A desirable purpose of a strip is, in general, to protect the contacts during brazing and, especially, in the case of female contacts, to prevent penetration of the brazing or cleaning product into the contact, or else to prevent penetration of the washing product, during the subsequent operation of cleaning the circuits. The strip would also desirably protect the contacts during the operation of varnishing the card.

It is often in this latter role of protection, for example, with respect to pollution of the contacts by undesirable materials where the known methods have problems. Because of sealing defects which can occur between existing strips and the heads of the contacts, pollutants are able to penetrate by capillarity into the contact openings.

Metal type strips have the further specific disadvantage of often damaging the contacts by forcing the female contact or by scratching of the protective layer, during the different fitting operations, and are not easy to hold in place during the brazing operation.

As for the known plastic material films, cited as of general interest, they have proved to be difficult to dismantle after brazing.

SUMMARY OF THE INVENTION

The aim of the present invention is to remedy these disadvantages of known devices and to provide efficient holding and protecting of the contacts prior to and during the above indicated operations.

To this end, a strip, in accordance with the invention, is characterized in that it is formed of a band of insulative material resisting the heat released during brazing and having cells opening on one side, these cells being adapted to receive sealingly, by elastic deformation, the heads of the contacts, and being spaced from each other according to a given pitch at which they will be brazed to the circuit card.

Such a strip has proved to be suitably adapted for connecting together a certain number of contacts while providing excellent sealing about the heads, and protecting them against penetration of polluting material before, during and after the operation for brazing the bodies of the contacts to the printed circuit card.

One embodiment of the invention will now be described by way of non-limiting example, with reference to the figures of the accompanying drawing in which.

The strip 1 shown in the different figures is formed of a band of plastic material which, in order to resist heat released during a brazing operation, is preferably formed of a polyamide resin. This strip comprises a number of cells 2 which may be circular in section and whose exact shape is clearly shown in FIG. 3.

These cells are disposed according to a given pitch, which would be the same as that by which the contacts will be inserted in a printed circuit card. Thus, for example, the spacing between the axes 3 of cells 2 may have the current standardized value of 2.54 mm.

It should be appreciated that the strips can be easily patterned in two directions, that is to say in the longitudinal direction and in the transverse direction, the mutual constant spacing between two adjacent contacts in each of these directions being, for instance, 2.54 mm. It should also be noted that the strip 1 may be separated or divided to have a particular number of cells, as desired.

Figure 1:
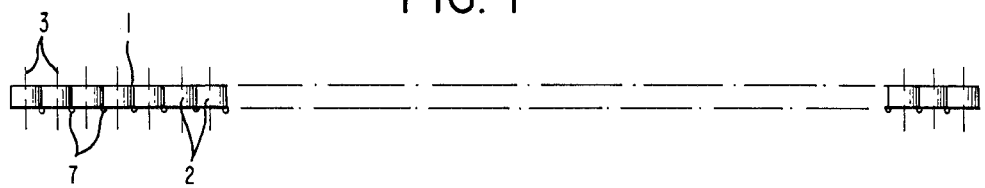
FIG. 1 is a side elevation view of a strip in accordance with the invention.
Figure 2:
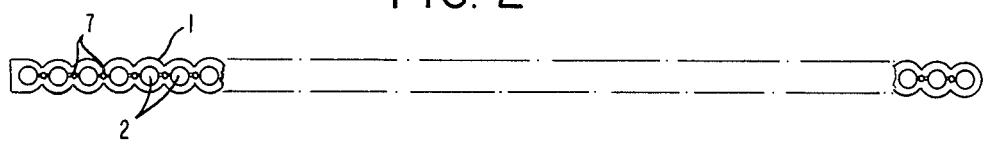
FIG. 2 is a bottom view of the strip of FIG. 1.
Figure 3:
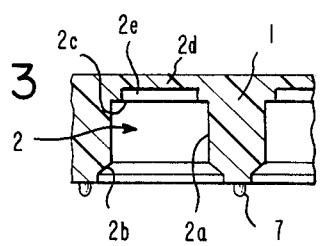
FIG. 3 is an enlarged view in longitudinal and partial axial section of the strip, showing the shape of the cells.

It can be seen in FIG. 3 that each cell 2 is formed of a cylindrical cavity 2a whose inlet-opening 2b is widened out so as to facilitate the forced penetration and positioning of the contact heads. This widening out of the inlet opening 2b may be obtained for example by a chamfer sloping by about 30° with respect to the insertion direction of the contact heads, namely the direction of the axis 3 of the cell.

The bottom 2c of the cylindrical cavity 2a forms an abutment surface with respect to the upper part of the contact heads when they are force fitted into the cavity 2a.

On the side opposite the inlet opening 2b, each cell 2 is closed by thin web 2d forming an integral part of strip 1. Between the lower wall of this web 2d and the bottom 2c of cavity 2a there is provided a space 2e intended to serve as an air pocket.

The selection of the thickness of web 2d in the preferred strip construction is significant. If this web is too thin, it risks being perforated during storage or handling to which the strip is subjected during use. On the other hand, if web 2d is too thick, the extension to which the strip is subjected due to the penetration of the contact heads into the assembly of cells (which extension is due to the radial expansion of each of them) will be substantially greater, at the level of cavities 2a, than the extension of the strip at its upper level, i.e. at the level of webs 2d. The result in this case could be that the strip would take on the shape of an arc of a circle, which could be troublesome both for storage and subsequent use of the strips, particularly at the time of positioning the contacts on the printed circuit card.

For a strip provided with cells to the above-identified pitch of 2.54 mm, the strip having a thickness equal or approximately equal to 1.8 mm, it has been determined, in one situation, that an appropriate thickness for the webs 2d was 1/9 of the total thickness of the strip, namely about 0.2 mm.

It should be understood, however, that this thickness will have to be chosen each time as a function of the pitch of the cells and of the other dimensions of the strip.

Figure 5:
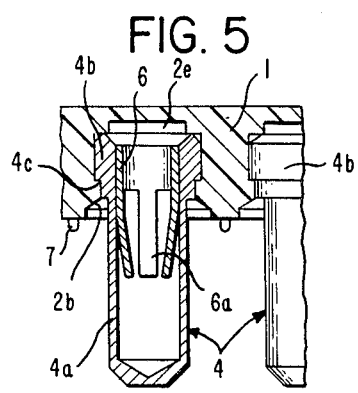
FIG. 5 is a partial sectional view, similar to that of FIG. 3, of a strip equipped with contacts.

FIG. 5 shows in elevation and in axial section the shape of contacts 4 in assembly in the strip 1 which has just been described. The female contacts have, on the one hand, a hollow body 4 that is preferably cylindrical and which is intended to pass through an opening in the printed card 5 and to be brazed on one side 5a thereof. On the other hand, the contacts include a head 4b which is also cylindrical but of a larger diameter than that of body 4a, this head 4b being intended to be positioned on the other side 5b of the printed circuit card. As is known, it is shown that in each of these female contacts 4 there is a clip 6 with claws 6a, adapted to ensure that the contact properly cooperates with a male contact (not shown), this strip 6 being made, for example, of beryllium bronze whereas body 4a may be made from tinned brass.

Figure 4:
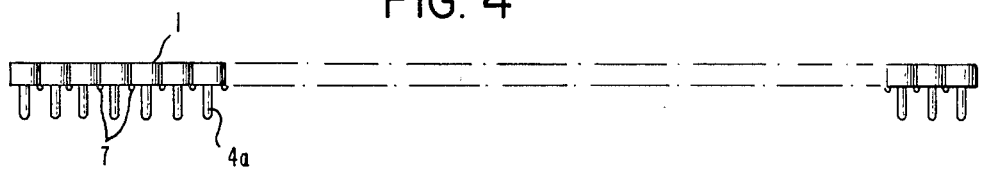
FIG. 4 is a side elevation view of the strip of FIG. 1, equipped with contacts.

Such being the case, it can be seen that head 4b of each of the contacts 4 may be readily engaged in the cylindrical cavity 2a of each of the cells by elastic deformation of the strip, until the upper end of head 4b comes into abutment against the surface 2c of the bottom of the cavity. During insertion of the contacts 4, the air may be slightly compressed in cavity space 2e. A strip 1 equipped entirely with such contacts is shown in FIG. 4. Each head 4b of the contacts 4 is cut as shown to have a shoulder 4c, so that, after the contact is placed in position, the plastic material of the strip expands around the shoulder 4c and assumes therefore a positive positioning of the contact in the cell, and an efficient tightness.

Figure 6:
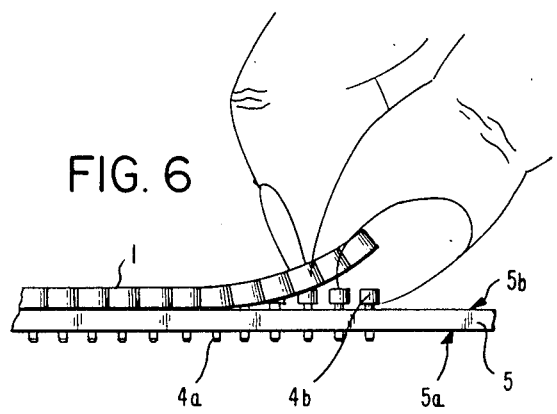
FIG. 6 is a side elevation view of an assembly of contacts brazed to a printed circuit card and whose heads are capped by a strip in accordance with the invention, during extraction.

All the bodies 4a of the contacts may then be engaged almost simultaneously in the holes disposed according to the same pitch on the printed circuit card 5 shown in FIG. 6, the strip 1 holding together all the contacts while maintaining the respective spacings therebetween.

The bodies 4a may then be brazed to side 5a of the card, without the risk of brazing material or cleaning products penetrating into the cells of the strip. In addition, such products or material are prevented access into the inner cavity of contacts 4.

During brazing, the air will be compressed in the space 2e, without causing a sealing defect between the periphery of head 4b and the lateral wall of cavity 2a.

The strip 1 will similarly protect the heads 4b during the operation for cleaning the card, then again during a subsequent varnishing operation.

Once all these operations are finally finished, the strip 1 may be very easily removed, as shown in FIG. 6, by pulling upwardly on one of its ends. Heads 4b of the contacts will then appear clean and ready for use.

As is evident, the invention is not limited to those modes of application and embodiments which have been described herein. It can be provided, for instance, that the strip has on its lower side, between the cells, pins also called "washing feet", which are shown in FIGS. 1–5 and referenced generally as numeral 7. These pins 7, which thereby elevate the strip 1, prevent the lower side of the strip 1 from coming into contact with the upper side 5b of the printed circuit card as illustrated in FIG. 6. The small space so provided between the strip and this upper side allows therefore the washing liquid to enter all the small interstices to be washed.

Figure 7:
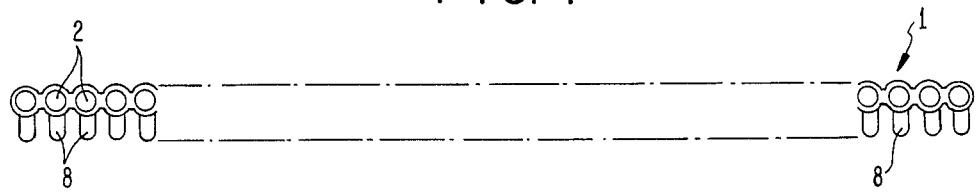
FIG. 7 is a bottom view of a strip made according to another embodiment of the present invention.
Figure 8:
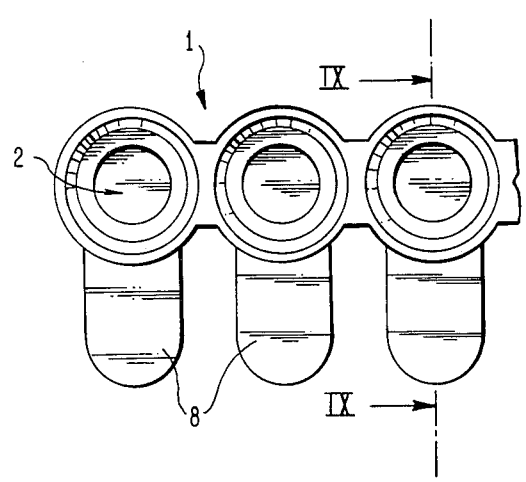
FIG. 8 is a bottom enlarged view of the strip of FIG. 7.
Figure 9:
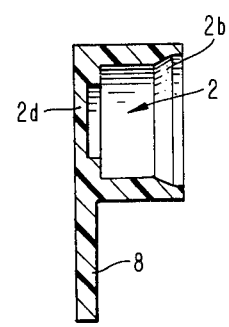
FIG. 9 is a sectional view taken along line IX—IX of FIG. 8.

FIGS. 7–9 disclose a strip made according to another embodiment of the invention. In these figures, the same references have been used to designate the same or similar parts of the strip as in the preceding figures.

The strip, in accordance with this embodiment, is provided with a plurality of laterally extending outer portions or tabs 8, which are preferably integral with the strip. As seen on FIG. 9, these tabs 8 extend from the bottom part of the strip, and remain therefore at a distance from the upper side 5b of the card 5 when the strip provided with its contacts is positioned onto the card. These tabs 8 serve as handles and can be easily grabbed by an operator's hand, thereby facilitating removal of the strip from the heads 4b of the contacts 4 after such contacts 4 have been soldered or brazed on the card.

Other modifications and variations of the present invention would be available to one skilled in the art without departing from the contemplated scope of the invention. The true scope of the invention is set forth in the following claims.

I claim:

1. A strip for holding, positioning to a given pitch and protecting contacts (4), in particular female contacts, to be brazed or soldered to a printed circuit card (5), said contacts having on one end, a body (4a) intended to pass through an opening in said card (5) and to be brazed on one side (5a) thereof, and, on the other opposite end, a head (4b) of larger width than the body (4a), intended to be positioned on the other side (5b) of the card, said head (4b) intended to receive a complementary contact, said strip comprisign a band (1) of resilient insulative material resisting heat released during brazing and having cells (2) opening only on one side thereof, said cells being adapted to receive sealingly, by elastic deformation, said heads (4b) of the contacts (4) and being spaced apart according to said given pitch, each cell being defined by a cavity (2a) extending into said one side, a bottom wall (2c) and a recess (2e) extending into said bottom wall, a portion of said bottom wall peripherally bounding said recess defining an abutment against which a contact head (4b) will bear upon receipt into said cell.

2. The strip according to claim 1, wherein said cells (2) have a widened inlet opening (2b), so as to facilitate the forced penetration and positioning of said heads (4b) of the contacts.

3. The strip according to claim 2, wherein said opening (2b) has a chamfer sloping by approximately 30° with respect to the insertion direction (3) of the head.

4. The strip according to claim 1 wherein on the side opposite said inlet opening (2b), said cell (2) is closed by a thin web (2d) forming an integral part of said band.

5. The strip according to claim 4, wherein said given pitch is approximately equal to 2.54 mm, and wherein said thin web (2*d*) has a thickness approximately equal to 1/9 of the total thickness of said band (1).

6. The strip according to claim 1 wherein said strip further comprises between each two adjacent cells (2), a projecting pin (7) adapted to engage an upper side (5*b*) of said card (5), to thereby elevate said strip and prevent said lower side of the strip from coming into contact with said upper side (5*b*) of the card.

7. The strip according to claim 1 wherein said strip further comprises a plurality of outer portions (8) extending laterally from said strip, said outer portions (8) serving as handles to facilitate handling of said strip.

8. The strip according to claim 1, wherein said insulative band is formed of plastic that is readily divisible such that said strip may be separated into any desired number of cells.

9. In combination:
   a plurality of electrical contacts, to be brazed or soldered to a printed circuit board (5), said contacts having on one end, a body (4*a*) intended to pass through an opening in said board (5) and to be brazed on one side (5*a*) thereof, and, on the other opposite end, a head (4*b*) of larger width than the body (4*a*), intended to be positioned on the other side (5*b*) of the card, said head (4*b*) having a cavity for receipt of a complementary contact; and
   a strip removably holding, positioning to a given pitch and protecting said contacts (4), said strip comprising a band (1) of resilient insulative material resisting heat released during brazing and having cells (2) opening on one side thereof, said cells sealingly receiving, by elastic deformation, said heads (4*b*) of the contacts (4) and being spaced apart according to said given pitch, said strip including a plurality of outer portions (8) projecting outwardly from said strip, said outer portions (8) serving as handles to facilitate handling of said strip and removal of said strip from said contacts subsequent to said contacts being brazed to said board.

10. The invention according to claim 9, wherein said cells (2) have a widened inlet opening (2*b*), so as to facilitate the forced penetration and positioning of said heads (4*b*) of the contacts.

11. The invention according to claim 10, wherein said opening (2*b*) has a chamfer sloping by approximately 30° with respect to the insertion direction (3) of the head.

12. The strip according to claim 9 wherein on the side opposite said inlet opening (2*b*), said cell (2) is closed by a thin web (2*d*) forming an integral part of said band.

13. The strip according to claim 12, wherein said given pitch is approximately equal to 2.54 mm, and wherein said thin web (2*b*) has a thickness approximately equal to 1/9 of the total thickness of said band (1).

14. The strip according to claim 12 wherein said cell 2 is defined by a bottom wall (2*c*) and abuts the end of the contact head (4*b*).

15. The strip according to claim 9 wherein said strip further comprises between each two adjacent cells (2), a projecting pin (7) adapted to engage an upper side (5*b*) of said board (5), to thereby elevate said strip and prevent said lower side of the strip from coming into contact with said upper side (5*b*) of the board.

16. The strip according to claim 9 wherein said outer portions (8) extend laterally from said strip.

* * * * *